United States Patent
Eguchi et al.

(10) Patent No.: US 6,297,122 B1
(45) Date of Patent: Oct. 2, 2001

(54) METHOD OF FORMING CONDUCTIVE FILM AND CAPACITOR

(75) Inventors: Kazuhiro Eguchi, Chigasaki; Tomonori Aoyama, Yokohama, both of (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/408,837

(22) Filed: Sep. 30, 1999

(30) Foreign Application Priority Data

Oct. 1, 1998 (JP) .................................... 10-280134

(51) Int. Cl.[7] .................................................. H01L 21/20
(52) U.S. Cl. ............................................ 438/396; 257/306
(58) Field of Search ................................ 438/3, 253, 254, 438/396, 240; 257/295, 306, 296, 298, 300, 71

(56) References Cited

U.S. PATENT DOCUMENTS

| 5,618,761 | | 4/1997 | Eguchi et al. . | |
|---|---|---|---|---|
| 5,629,229 | * | 5/1997 | Si et al. | 438/3 |
| 6,051,859 | * | 4/2000 | Hosotani et al. | 257/306 |
| 6,066,528 | * | 5/2000 | Fazan et al. | 438/253 |
| 6,075,264 | * | 6/2000 | Koo | 257/295 |

FOREIGN PATENT DOCUMENTS 9-27602   1/1997   (JP) .

* cited by examiner

*Primary Examiner*—David Nelms
*Assistant Examiner*—David Vu
(74) *Attorney, Agent, or Firm*—Finnegan, Henderson, Farabow, Garrett & Dunner, L.L.P.

(57) ABSTRACT

An $SrRuO_3$ film as the lower electrode and upper electrode of a capacitor is formed by CVD using a gas mixture of $Sr(THD)_2$ and $Ru(THD)_3$ as source gases. A $Ba_xSr_{1-x}RuO_3$ film is used as a capacitor insulating film.

15 Claims, 5 Drawing Sheets

METHOD OF FORMING CONDUCTIVE FILM AND CAPACITOR

BACKGROUND OF THE INVENTION

As the scale of semiconductor integrated circuits which are typified by a DRAM becomes larger and the miniaturization of ICs progresses, the device area becomes smaller generation by generation. For a DRAM each of its memory cells is comprised of a single transistor and a single capacitor, the reduction in device area decreases the area of the capacitor that stores information, thereby lowering the information memory capability.

For semiconductor memory devices like DRAMs, various attempts have been made to secure a sufficient capacitance of each capacitor in order to prevent the information memory capability from being impaired by the large scale integration and miniaturization.

One of the attempts is to use a material which has a higher dielectric constant than the conventional oxide $SiO_2/SiN$ film. Materials with a high dielectric constant include strontium titanate ($SrTiO_3$) and strontium barium titanate (($Ba,Sr)TiO_3$) (BST).

Studies are also being made on the use of a thin film of a functional material of a ferroelectric substance such as $Pb(Zr_{1-x}, Ti_x)O_3$ (PZT) or $SrBi_2Ta_2O_9$ (SBT), and people have begun to propose devices with very new functions, such as an FRAM (Ferroelectric Random Access read write Memory).

In using those dielectric substances in capacitors of semiconductor memory devices, it is typical to use noble metals like Pt, Ru and Ir or their oxides as the upper and lower electrodes that sandwich the capacitor insulating film.

The reason for the above is that BST, PZT and SBT are oxides and the lower electrode is exposed to an oxygen environment at the time of forming those films, so that it is essential to prevent oxidization of the surface of the lower electrode.

It has recently been reported that the characteristic of a capacitor is improved by using a conductive perovskite oxide film like an $SrRuO_3$ film as the capacitor electrode. That is, the use of this type of a capacitor can dramatically improve the reliability of capacitors in a DRAM or FRAM.

In adapting a capacitor whose capacitor insulating film is formed of a high dielectric substance or ferroelectric substance in a semiconductor memory device of a large scale integration like a DRAM or FRAM, CVD is used as a scheme of forming the capacitor electrode as well as a scheme of forming the capacitor insulating film for the following reason.

Attempts to provide larger integration and further miniaturization of semiconductor memory devices like a DRAM will continue in the future and it is essential to form capacitors into a three-dimensional structure in order to secure the necessary amount of signals for the operation of such a semiconductor memory device. CVD which can be expected to provide an excellent step coverage is therefore effective in making such a design.

The formation of a conductive perovskite oxide thin film by CVD is disclosed in Jpn. Pat. Appln. KOKAI Publication No. Hei 9-27602. This method forms a $(Ba_{1-x}Sr_x)RuO_3$ film by CVD using $Ba(THD)_2$, $Sr(THD)_2$ and $Ru(Cp)_2$ as raw materials where THD is $C_{11}H_{19}O_2$(2,2,6,6-tetramethyl-3,5-heptanedionato) and Cp is $C_5H_5$.

A perovskite oxide has a conductivity only in the vicinity of the stoichiometric composition, and its electric conductivity gets lower as the composition deviates from the stoichiometric composition. As the composition of $SrRuO_3$ deviates from Sr/Ru=1, for example, the electric conductivity will not be seen. When Sr/Ru>1 at which the composition approaches SrO, particularly, this tendency becomes prominent.

BRIEF SUMMARY OF THE INVENTION

The present inventors discovered that the conventional method of forming a conductive perovskite oxide film (Jpn. Pat. Appln. KOKAI Publication No. Hei 9-27602) had the following problems.

When $(Ba_{1-x}Sr_x)RuO_3$ is formed by this method, problems arise, such that the composition does not becomes uniform (particularly, the composition becomes non-uniform in the widthwise direction), and the composition and the non-uniformity of the composition vary depending on the type of the substrate that serves as a base.

In particular, in a case of using the aforementioned conductive perovskite oxide film as the lower electrode of a DRAM capacitor which uses a capacitor insulating film with a high dielectric constant like a $Ba_{0.5}Sr_{0.5}TiO_3$ film, the base for the lower electrode is comprised of a plurality of materials so that the uniformity of the composition gets poorer.

As mentioned above, a perovskite oxide has a conductivity only in the vicinity of the stoichiometric composition, and its electric conductivity gets lower as the composition deviates from the stoichiometric composition. The present inventors found out that such a phenomenon would lead to the following problem.

If a perovskite oxide film is used as the lower electrode of a capacitor, the aforementioned phenomenon leads to the formation of a layer with no electric conductivity in part of the perovskite oxide film, and, in the worst case, results in the formation of a high-resistance perovskite oxide film which cannot be used as the lower electrode. It is therefore difficult to adapt the conventional method of forming a perovskite oxide film to capacitors of a semiconductor memory device like a DRAM.

Accordingly, it is an object of the present invention to provide a method of forming a conductive film of $ARuO_3$ (A being a substance containing at least one of elements Ca, Sr and Ba) and a method of forming a capacitor uses $ARuO_3$ as an electrode material, which methods can reduce the non-uniformity of composition.

To achieve this object, according to one aspect of this invention, there is provided a conductive film forming method comprising the steps of preparing a substrate; and forming a conductive film of $ARuO_3$ (A being a substance containing at least one of elements Ca, Sr and Ba) on the substrate by CVD using a β diketone complex of Ru as Ru materials.

The following are some of more specific modes of the conductive film embodying this invention.

(1) A THD compound ($=C_{11}H_{19}O_2$) is used as the β diketone complex.

(2) $SrRuO_3$ is used as $AruO_3$ ($=Ca_xBa_ySr_{1-x-y}RuO$ ($0 \leq x \leq 1$, $0 \leq y \leq 1$)).

(3) The β diketone complex dissolved in a liquid is used.

(4) As the A material, the β diketone complex of A is used. It is preferable that the β diketone complex of the A material be the same as the β diketone complex of the Ru material.

(5) After a plurality of regions of different materials are formed on the same surface of the substrate, the conductive film is formed on those regions.

According to another aspect of this invention, there is provided a capacitor forming method comprising the steps of forming a lower electrode on a substrate; forming a capacitor insulating film of $Ba_xSr_{1-x}TiO_3$ ($0 \leq x \leq 1$) on the lower electrode; and forming an upper electrode on the capacitor insulating film, as at least one of the lower electrode and the upper electrode, a conductive film of $ARuO_3$ (A being a substance containing at least one of elements Ca, Sr and Ba) being formed by CVD using a β diketone complex of Ru as an Ru material.

According to a further aspect of this invention, there is provided a capacitor forming method comprising the steps of a preparing a semiconductor substrate having a conductive region; forming a first insulating film on the semiconductor substrate; forming a first opening in the first insulating film and burying inside the first opening with a connecting member which electrically connects to the conductive region; forming a lower electrode, which electrically connects to the connecting member, on the first insulating film; forming a capacitor insulating film of $Ba_xSr_{1-x}TiO_3$ ($0 \leq x \leq 1$) on the lower electrode; and forming an upper electrode on the capacitor insulating film, as at least one of the lower electrode and the upper electrode, a conductive film of $ARuO_3$ (A being a substance containing at least one of elements Ca, Sr and Ba) being formed by CVD using a β diketone complex of Ru as an Ru material.

The following are preferable modes of those capacitor forming methods embodying this invention.

(1) The connecting member is formed after a barrier metal film is formed on the side wall of the second opening.

(2) The connecting member is of tungsten.

(3) The barrier metal film is formed on the top surface of the connecting member.

(4) The barrier metal film is one of a TiN film, TiAlN film and Ru film.

Through experiments conducted on the formation of an Ru film by CVD using $Ru(Cp)_2$ or $Ru(EtCp)_2$ and $O_2$ as source gases, the present inventors found out that it would take several minutes for the Ru film to start being formed since the supply of the source gases into a reactor had initiated. They further found out that the time for the Ru film to start being formed since the beginning of the supply of the source gases varies greatly depending on the type of the base. They also discovered that the formation of $Sr(THD)_2$ would take place immediately after the source gases had started being supplied into the reactor.

The results of the above experiments showed that in a case of forming an SrO film by CVD using $Sr(THD)_2$ and $Ru(Cp)_2$, the process of forming the film considerably differs between $Sr(THD)_2$ and $Ru(Cp)_2$, resulting in the uniform distribution of the composition in the widthwise direction of the film.

By way of contrast, the use of a material consisting of both Ru and a β diketone complex as the Ru material as done in this invention, can apparently form $ARuO_3$ whose composition is uniform in the widthwise direction of the film.

This is because that this invention can permit the use of similar compounds as the Sr and Ru materials, so that $Sr(THD)_2$ and $Ru(THD)_3$, for example, can be used. In this case, chemical reactions like decomposition of the raw materials at the time of forming the film become similar to each other, thus resulting in acquisition of an $SrRuO_3$ film which has a uniform composition distribution in the widthwise direction of the film.

Since $Sr(THD)_2$ and $Ru(THD)_3$ are similar compounds, there is a less mutual reaction between the raw materials so that the target film can be formed by CVD with an excellent controllability. Further, it became apparent that an $SrRuO_3$ film could be formed with a good uniformity on the base comprised of plural types of materials, which would become important at the time of adapting the film to capacitors of a DRAM or the like, regardless of the type of the materials of the base.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Preferred embodiments of the present invention will now be described with reference to the accompanying drawings.

FIRST EMBODIMENT

Figure 1A:
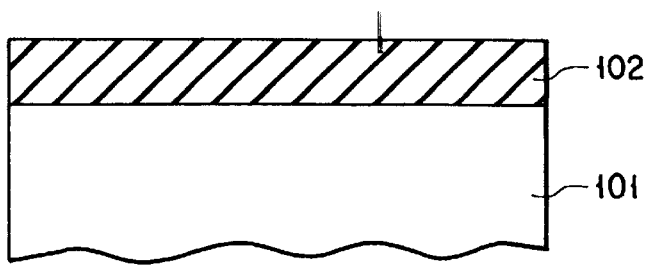
FIGS. 1A and 1B are cross-sectional views illustrating the steps of a method of forming an $SrRuO_3$ film according to a first embodiment of this invention.
Figure 1B:
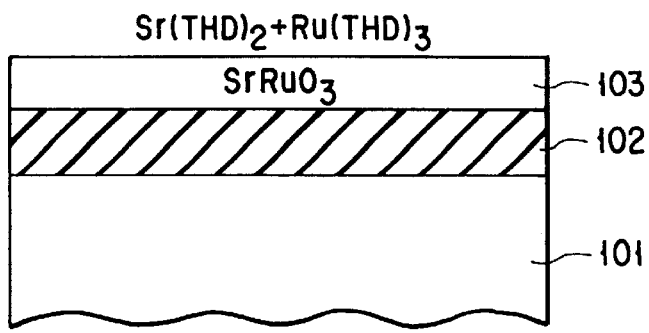

FIGS. 1A and 1B are cross-sectional views illustrating the steps of a method of forming an $SrRuO_3$ film according to a first embodiment of this invention.

First, an $SiO_2$ film 102 with a thickness of 100 nm is formed on the surface of an Si substrate 101 by thermal oxidization, as shown in FIG. 1A. Next, as shown in FIG.

1B, an SrRuO$_3$ film 103 is formed on the SiO$_2$ film 102 by CVD using a gas mixture of Sr(THD)$_2$ and Ru(THD)$_3$ as the source gases.

Figure 2:
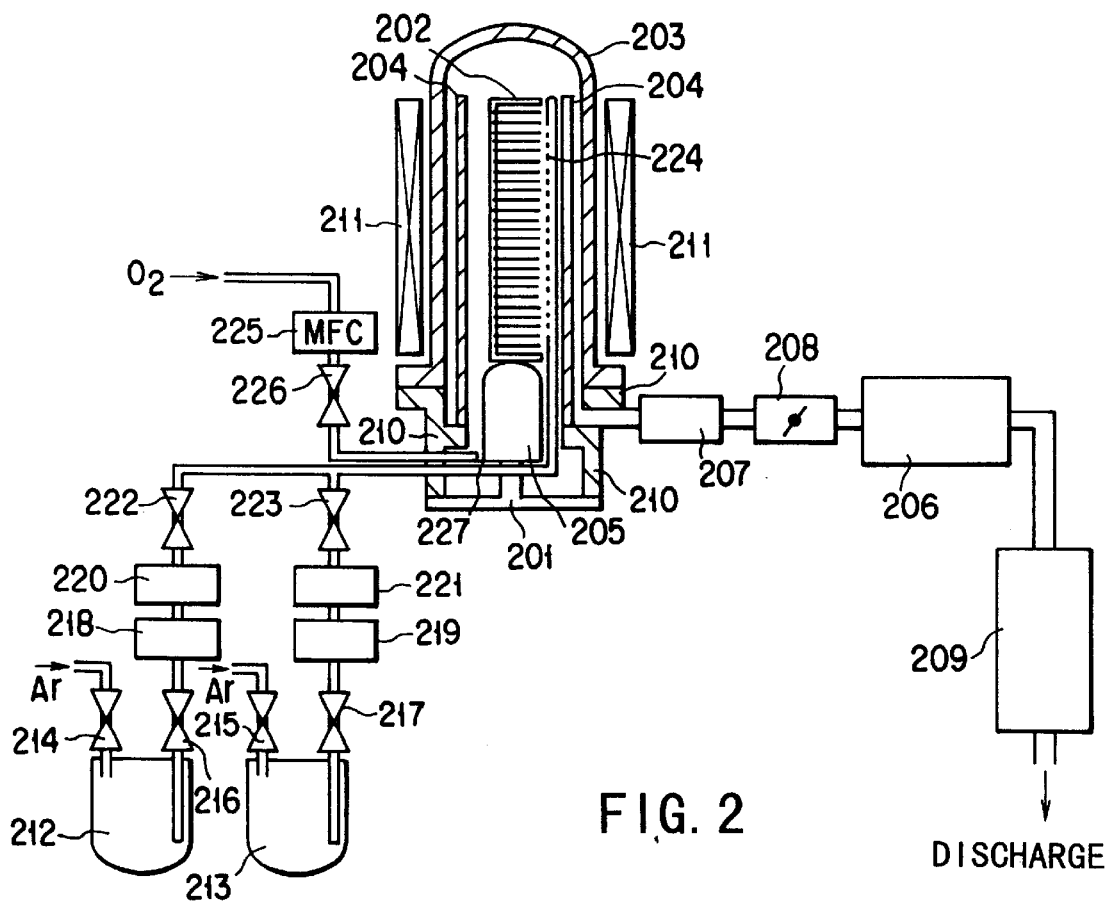
FIG. 2 is an exemplary diagram of a CVD system which is used to form a conductive film according to this invention.

The following will specifically discuss how to form the SrRuO$_3$ film 103. FIG. 2 presents an exemplary diagram of a CVD system which is used to form the SrRuO$_3$ film 103.

First, with a cap 201 open, after a wafer boat 202 of quartz is lowered to the position where the Si substrate 101 (substrate to be processed) with the SiO$_2$ film 102 formed thereon can be mounted on the wafer boat 202, 25 substrates to be processed are mounted on the wafer boat 202.

Next, the wafer boat 202 is placed in a furnace (having an outer tube 203 of quartz and an inner tube 204 of quartz), then the cap 201 is closed. A heat insulating cylinder 205 is provided in the furnace. The temperature inside the furnace is 300° C. or lower. After the substrates to be processed are placed in the furnace, the inside the furnace is evacuated into vacuum to remove the air which interferes with excellent CVD-based film formation from inside the furnace.

A filter 207 and a pressure regulating valve 208 are provided between the furnace and a dry pump 206. The dry pump 206 is connected to an exhaust gas processing device 209. In the diagram, reference symbol "210" denotes a manifold (a quartz tube support provided with a gas inlet port, a gas discharge port, etc.).

After the environment in the furnace becomes clean, the pressure regulating valve 208 is adjusted to set the pressure inside the furnace to the level desired for film formation. The pressure here is 1 Torr.

At the same time as this pressure adjustment is made, the temperature in the furnace is increased to the level necessary to form the SrRuO$_3$ film 103 by adjusting the power of a heater 211. This temperature is 550° C. in this embodiment.

The procedures up to this point are a preparation phase before forming the SrRuO$_3$ film 103.

The raw materials used for the SrRuO$_3$ film 103 are Sr(THD)$_2$ dissolved into THF (Tetrahydrofuran: C$_4$H$_8$O) at the concentration of 0.1 mol/l and Ru(THD)$_3$ dissolved into THF at the concentration of 0.1 mol/l.

The individual raw materials are supplied from independent containers 212 and 213 of stainless steel. An Ar gas is used as a carrier gas. The Ar gas is fed into the containers 212 and 213 via valves 214 and 215, respectively, and is fed together with the raw materials into fluid-flow-rate regulators 218 and 219 via valves 216 and 217, respectively.

The fluid-flow-rate regulators 218 and 219 regulate the flow rates of the respective fluid materials in such a way that the composition ratio of Sr/Ru of the SrRuO$_3$ film 103 becomes approximately 1. The flow rates are 0.4 sccm for Sr(THD)$_2$/THF and 0.5 sccm for Ru(THD)$_3$/THF.

The raw materials whose flow rates have been controlled in this manner are respectively vaporized into gases by vaporizers 220 and 221. The temperatures of the vaporizers are set to 250° C. for the Sr material and 210° C. for the Ru material.

Valves 222 and 223 are opened to start supplying the gaseous materials to the to-be-processed substrates from gas feeding nozzles 224 to thereby initiate the formation of the SrRuO$_3$ film 103.

At the same time, a valve 226 is opened to start supplying the O$_2$ gas whose flow rate has been controlled to 1000 sccm by a mass-flow controller 225 from a gas feeding nozzle 227. The film formation is carried out for 30 minutes.

After film formation, the valves 222 and 223 are closed to stop supplying the source gases of Sr and Ru. After the supply of the source gases is stopped, power supply to the heater 211 is stopped so that the temperature in the furnace becomes equal to or lower than 300° C., thereby cooling the furnace.

During this cooling period, the O$_2$ gas is kept supplied to prevent alteration of the surface of the deposited SrRuO$_3$ film 103, particularly, separation of the element O from that surface.

When the temperature in the furnace becomes equal to or lower than 300° C., the supply of the O$_2$ gas is stopped and the Ar gas is fed into the furnace to return the pressure in the furnace to the atmospheric pressure. Then, the cap 201 is removed and the wafer boat 202 is lowered, after which the 25 Si substrates 101 on which the SrRuO$_3$ film 103 has been deposited are removed.

The thickness of the SrRuO$_3$ film 103 deposited on those Si substrates 101 was measured to be 80 nm. The Sr/Ru composition ratio of the SrRuO$_3$ film 103 was approximately 1 and the composition distribution of the SrRuO$_3$ film 103 in the widthwise direction of the film was uniform over the entire film.

The uniformities of the film thickness and the composition over the substrate surface and among the 25 substrates were equal to or smaller than ±5%. Further, the X-ray diffraction measurement showed that the SrRuO$_3$ film 103 was a perovskite type polycrystal. The sheet resistance of the SrRuO$_3$ film 103 was 30 Ω☐.

For the purpose of comparison, the SrRuO$_3$ film was formed using Ru(Cp)$_2$ (CP: C$_5$H$_5$) dissolved into THF at the concentration of 0.1 mol/l as the Ru material.

At this time, the flow rate of the solution of the Ru material was 0.5 sccm and the temperature of the vaporizer was 150° C. The other procedures of forming the SrRuO$_3$ film including the type of the Sr material and the feeding conditions were quite the same as those mentioned above.

The thickness of the SrRuO$_3$ film formed by this method was 80 nm, the same as the aforementioned one. However, the X-ray diffraction measurement showed that SrRuO$_3$ had a peak whose intensity was merely about ⅕ of the peak intensity in the case where Ru(THD)$_3$ was used for the Ru material.

The sheet resistance of the SrRuO$_3$ film was 60 Ω☐. The results of measuring the composition distribution in the widthwise direction of the film showed Sr/Ru=1.3 at the depth of 50 nm from the surface and that the Ru content from the depth of 50 nm from the surface to the interface with the SiO$_2$ film was nearly 0 so that there was SrO in that range.

The factors to have increased the sheet resistance was the insulator, SrO, formed near the interface between the SiO$_2$ film and the SrRuO$_3$ film and the Sr/Ru composition ratio being shifted from the stoichiometric composition of 1 even near the surface.

The present inventors also confirmed that CVD of the Ru film using Ru(Cp)$_2$ and O$_2$ provided an incubation time in which the film is not deposited for several minutes since the initiation of the film formation. It appears that this incubation time prevented the Ru material from being contained in the Ru film at the initial stage of the film formation, leaving SrO, which formed SrO in the vicinity of the interface.

After film formation was repeated, the present inventors checked the inside of the gas feeding pipe and found deposition of an Ru oxide and Ru metal in the pipe. The decomposition and deposition of the Ru material in the pipe caused the Sr/Ru composition ratio of the film to become larger than 1.

The following is the reason for the deposition of an Ru oxide and Ru metal in the pipe in the case of using Ru(Cp)$_2$. While decomposition of Ru(Cp)$_2$ occurred at about 200° C. or higher, the vaporization temperature of the Sr material was 250° C. so that the heating temperature for the gas feeding pipe was set to 260° C., resulting in decomposition of Ru(Cp)$_2$.

In the case of using Ru(THD)$_3$ for the Ru material, by way of contrast, no deposition of an Ru oxide and Ru metal or the like in the gas feeding pipe was not observed.

In the case of CVD using Sr(THD)$_2$ and Ru(Cp)$_2$ as the raw materials, it is apparent from the above that the poor controllability of providing non-uniform composition in the widthwise direction of the film is due to a significant difference between the thermal decomposition characteristics of Sr(THD)$_2$ and Ru(Cp)$_2$.

That is, while the thermal decomposition temperature of Sr(THD)$_2$ is 400° C. or higher, the thermal decomposition temperature of Ru(Cp)$_2$ is about 200° C., and this difference leads to inadequate feeding of the raw materials, thus resulting in poor composition controllability.

Figure 3A:
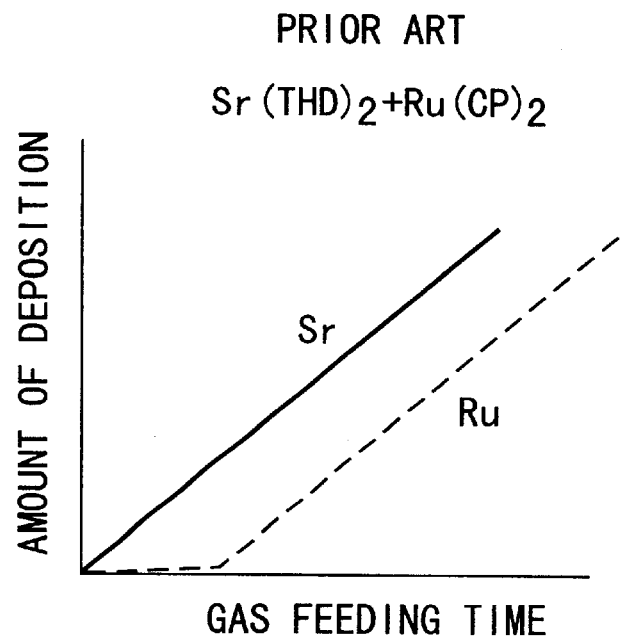
FIGS. 3A through 3C are diagrams for explaining the problems for film formation by CVD using $Sr(THD)_2$ and $Ru(Cp)_2$.
Figure 3B:
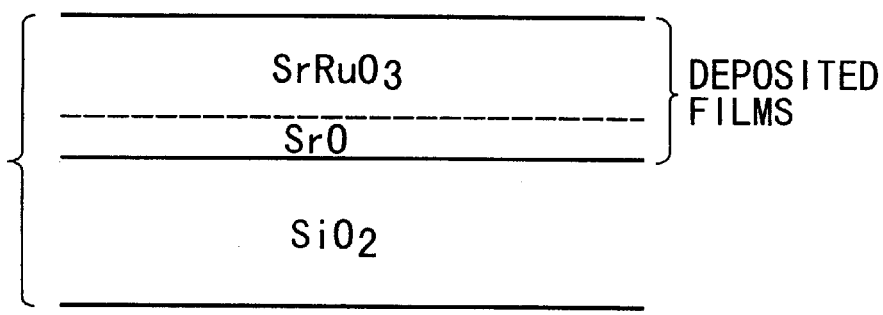
Figure 3C:
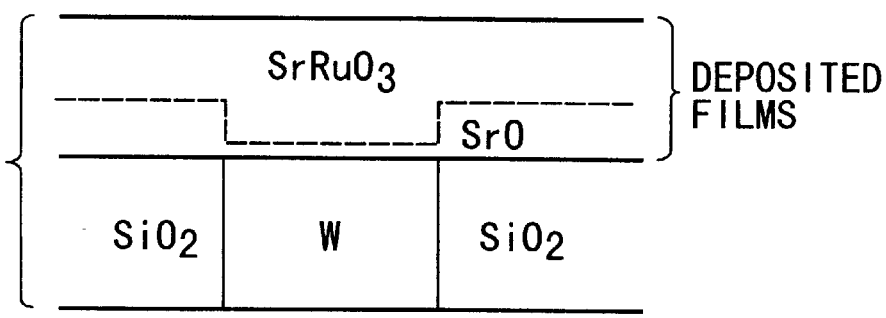

In the case of CVD using Sr(THD)$_2$ and Ru(Cp)$_2$, as shown in FIGS. 3A and 3B, the presence of the incubation time is also a factor to cause the non-uniformity of the composition in the widthwise direction of the film. In addition, the composition showed some dependency on the base, as shown in FIG. 3C.

Figure 4A:
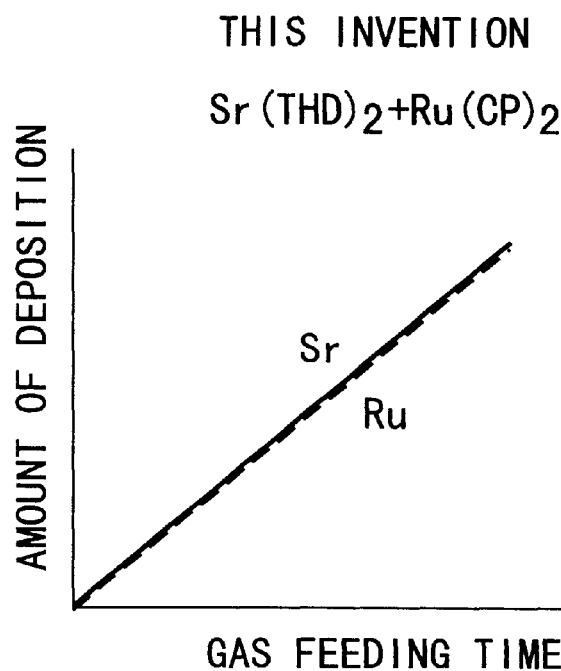
FIGS. 4A through 4C are diagrams for explaining the problems for film formation by CVD using $Sr(THD)_2$ and $Ru(THD)_3$.
Figure 4B:
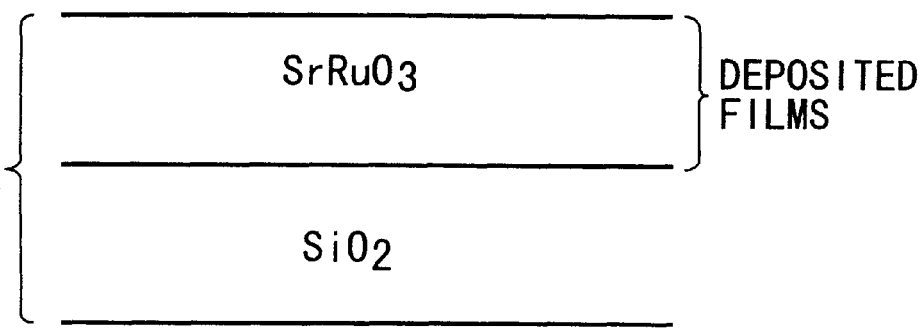
Figure 4C:
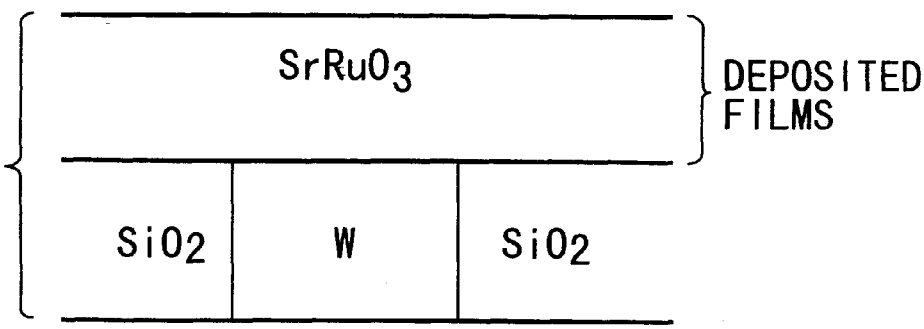

In the case of CVD using Sr(THD)$_2$ and Ru(THD)$_3$, by way of contrast, the thermal decomposition temperatures of Sr(THD)$_2$ and Ru(THD)$_3$ are close to each other and, as shown in FIGS. 4A and 4B, there is no incubation time in the film formation, which inhibits non-uniformity of the composition in the widthwise direction of the film and prevents the composition controllability from being impaired by unstable feeding of the source gases. Further, the composition did not show any dependency on the base, as shown in FIG. 4C.

According to the conventional method, the incubation time has a dependency on the film forming temperature. As one example, the incubation times for various kinds of bases (Si, SiO$_2$, W, TiN and Ru) at the film forming temperature of 230° C. are shown below.

Si: over 60 minutes
SiO$_2$: 23 minutes
W: 6 minutes
TiN: 8 minutes
Ru: 0 minutes It is considered that the incubation time for TiNAl does not differ much from that for TiN.

In an actual DRAM, the barrier metal film exists in the base of the lower electrode in addition to the interlayer insulating film. In view of this fact, SiO$_2$ & W, SiO$_2$ & TiN, SiO$_2$ & TiAlN, SiO$_2$ & Ru and so forth are possible for the base of the lower electrode of an actual DRAM.

When the conventional method is adapted to an actual DRAM, therefore, the lower electrode in which SrO component is distributed in the widthwise direction of the film is formed and this distribution varies depending on the underlying material.

In an extreme case, such as when the film forming time is shorter than the incubation time, the SrO film alone is formed. The SrO film is an insulating film and does not thus serve as the lower electrode. This problem may arise in a capacitor of the type which will be discussed in the later section of a fifth embodiment, because the SrO film in this capacitor is thin.

Liquid materials having Sr(THD)$_2$ and Ru(THD)$_3$ dissolved in THF are used in this embodiment; however, the present inventors confirmed that even if an organic solvent other than THF were used as a solvent or the raw materials themselves were supplied in a gaseous phase through sublimation, nearly the same results as obtained in this embodiment were acquired. That is, it was confirmed that quite the same advantages would be obtained as long as the types of compounds of the raw materials are all THD complexes regardless of how the raw materials are supplied.

SECOND EMBODIMENT

Figure 5A:
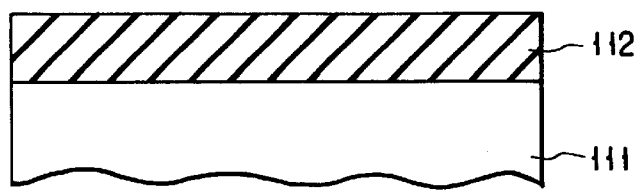
FIGS. 5A and 5B are cross-sectional views illustrating the steps of a method of forming a $Ca_xSr_{1-x}RuO_3$ film according to a second embodiment of this invention.
Figure 5B:
Figure 5B:
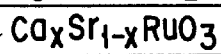
Figure 5B:
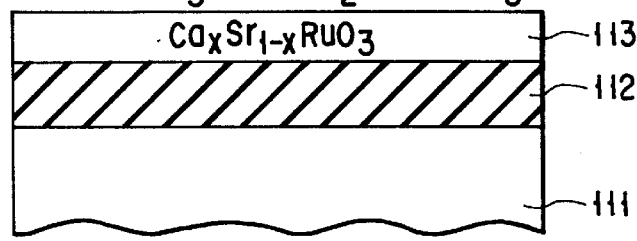

FIGS. 5A and 5B are cross-sectional views illustrating the steps of a method of forming a Ca$_x$Sr$_{1-x}$RuO$_3$ film according to a second embodiment of this invention.

First, an SiO$_2$ film 112 with a thickness of 100 nm is formed on the surface of an Si substrate 111 by thermal oxidation, as shown in FIG. 5A. Next, as shown in FIG. 5B, a Ca$_x$Sr$_{1-x}$RuO$_3$ film 113 is formed on the SiO$_2$ film 112 by CVD using a gas mixture of Ca(THD)$_2$, Sr(THD)$_2$ and Ru(THD)$_3$ as the source gases.

The following will specifically discuss how to form the Ca$_x$Sr$_{1-x}$RuO$_3$ film 113. A CVD system as shown in FIG. 2 is used to form the Ca$_x$Sr$_{1-x}$RuO$_3$ film 113. Although FIG. 2 shows only two raw-material feeding systems each including a raw material container, a fluid-flow-rate regulator and an vaporizer, three raw-material feeding systems were used in this embodiment.

The procedures of forming the Ca$_x$Sr$_{1-x}$RuO$_3$ film 113 using this CVD system are the same as the procedures of forming the SrRuO$_3$ film 103 in the first embodiment.

The following are the conditions for forming the Ca$_x$Sr$_{1-x}$RuO$_3$ film.

The film forming pressures is 1 Torr, the film forming temperature is 550° C., raw materials used are Sr(THD)$_2$ dissolved into THF at the concentration of 0.1 mol/l, Ru(THD)$_3$ dissolved into THF at the concentration of 0.1 mol/l, and Ca(THD)$_2$ dissolved into THF at the concentration of 0.1 mol/l.

The flow rates for the individual liquid materials are 0.2 sccm for Sr(THD)$_2$/THF, 0.2 sccm for Ca(THD)$_2$ and 0.5 sccm for Ru(THD)$_3$/THF.

The temperature of the vaporizer for the Ca material is 180° C., and the temperatures of the vaporizers for the Sr and Ru materials are respectively 250° C. and 210° C., the same as those in the first embodiment. The other conditions are also the same as those of the first embodiment. The film formation is carried out for 30 minutes.

The thickness of the Ca$_x$Sr$_{1-x}$RuO$_3$ film 113 obtained by the above method was 80 nm. The (Sr+Ca)/Ru composition ratio was approximately 1 and the composition distribution of the Ca$_x$Sr$_{1-x}$RuO$_3$ film 113 in the widthwise direction of the film was uniform over the entire film. The composition x was 0.5.

The uniformities of the film thickness and the composition over the substrate surface and among the 25 substrates were equal to or smaller than ±5%. Further, the X-ray diffraction measurement showed that the deposited Ca$_x$Sr$_{1-x}$RuO$_3$ film 113 was a perovskite type polycrystal. The sheet resistance of the Ca$_x$Sr$_{1-x}$RuO$_3$ film 113 was 50 Ω□.

As a comparative example, the Ca$_x$Sr$_{1-x}$RuO$_3$ film was formed by CVD using Ru(Cp)$_2$ (CP: C$_5$H$_5$) dissolved into THF at the concentration of 0.1 mol/l as the Ru material.

At this time, the flow rate of the solution of the Ru material was 0.5 sccm and the temperature of the vaporizer was 150° C. The other procedures of forming the $Ca_xSr_{1-x}RuO_3$ film including the type of the Sr material and the feeding conditions were quite the same as those mentioned above.

The thickness of the $Ca_xSr_{1-x}RuO_3$ film formed in this manner was 80 nm, the same as the aforementioned one. However, the X-ray diffraction measurement showed that $Ca_xSr_{1-x}RuO_3$ had a peak whose intensity was merely about 1/7 of the peak intensity in the case where $Ru(THD)_3$ was used for the Ru material. The sheet resistance of the $Ca_xSr_{1-x}RuO_3$ film was 100 Ω□.

The results of measuring the composition distribution in the widthwise direction of the film showed (Sr+Ca)/Ru=1.3 at the depth of 50 nm from the surface and that the Ru content from the depth of 50 nm from the surface to the interface with the $SiO_2$ film was nearly 0 so that there was Sr—Ca—O in that range.

The factors to have increased the sheet resistance was the insulator, Sr—Ca—O, formed near the interface between the $SiO_2$ film and the $Ca_xSr_{1-x}RuO_3$ film and the (Sr+Ca)/Ru composition ratio being deviated from the stoichiometric composition of 1 even near the surface.

The fact that the presence of the incubation time in a case of using $Ru(Cp)_2$ as the Ru material inhibited Ru from being contained in the film in the initial stage of the film formation, leaving Sr—Ca—O, which formed Sr—Ca—O in the vicinity of the interface, is the same as for the case of the $SrRuO_3$ film in the first embodiment.

After film formation was repeated, deposition of an Ru oxide and Ru metal in the gas feeding pipe was found as per the case of forming the $SrRuO_3$ film in the first embodiment. The decomposition and deposition of the Ru material in the pipe caused the (Sr+Ca)/Ru composition ratio of the film to become larger than 1.

The following is the reason for the deposition of an Ru oxide and Ru metal in the pipe in the case of using $Ru(Cp)_2$. While decomposition of $Ru(Cp)_2$ occurred at about 200° C. or higher, the vaporization temperature of the Sr material was 250° C. so that the heating temperature for the gas feeding pipe was set to 260° C., resulting in decomposition of $Ru(Cp)_2$.

In the case of using $Ru(THD)_3$ for the Ru material, by way of contrast, no deposition of an Ru oxide and Ru metal or the like in the gas feeding pipe was observed.

In the case of the $Ca_xSr_{1-x}RuO_3$ film, as in the case of the $SrRuO_3$ film in the first embodiment, it was confirmed that the use of THD compounds for all the materials for Ca, Sr and Ru ensured film formation by CVD in such a way as not to cause the non-uniformity of the composition in the widthwise direction of the film and as to prevent the composition controllability from being impaired by unstable feeding of the source gases. Further, when the $Ca_xSr_{1-x}RuO_3$ film was formed on various kinds of bases by CVD, there were no dependency of the composition on the bases.

Liquid materials having $Ca(THD)_3$, $Sr(THD)_2$ and $Ru(THD)_3$ dissolved in THF are used in this embodiment; however, the present inventors confirmed that even if an organic solvent other than THF were used as a solvent or the raw materials themselves were supplied in a gaseous phase through sublimation, nearly the same results as obtained in this embodiment were acquired. That is, it was confirmed that quite the same advantages would be obtained as long as the types of compounds of the raw materials are all THD complexes regardless of how the raw materials are supplied.

THIRD EMBODIMENT

Figure 6A:
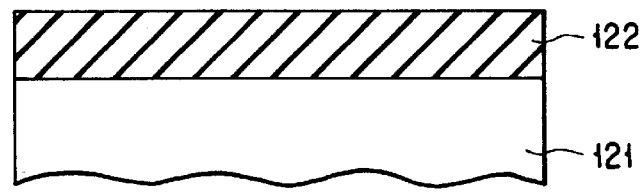
FIGS. 6A and 6B are cross-sectional views illustrating the steps of a method of forming a $Ba_xSr_{1-x}RuO_3$ film according to a third embodiment of this invention.
Figure 6B:
Figure 6B:
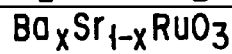
Figure 6B:
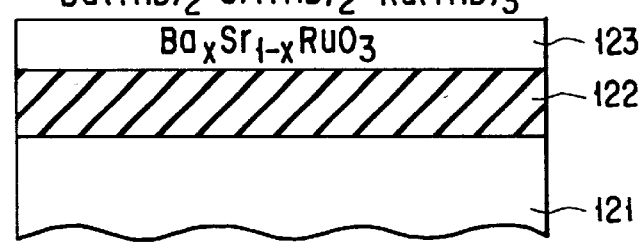

FIGS. 6A and 6B are cross-sectional views illustrating the steps of a method of forming a $Ba_xSr_{1-x}RuO_3$ film according to a third embodiment of this invention.

First, an $SiO_2$ film 122 with a thickness of 100 nm is formed on the surface of an Si substrate 121 by thermal oxidization, as shown in FIG. 6A. Next, as shown in FIG. 6B, a $Ba_xSr_{1-x}RuO_3$ film 123 is formed on the $SiO_2$ film 122 by CVD using a gas mixture of $Ba(THD)_2$, $Sr(THD)_2$ and $Ru(THD)_3$ as the source gases.

The following will specifically discuss how to form the $Ba_xSr_{1-x}RuO_3$ film 123. A CVD system as shown in FIG. 2 is used to form the $Ba_xSr_{1-x}RuO_3$ film 123. Although FIG. 2 shows only two raw-material feeding systems each including a raw material container, a fluid-flow-rate regulator and an vaporizer, three raw-material feeding systems were used in this embodiment.

The procedures of forming the $Ba_xSr_{1-x}RuO_3$ film 123 using this CVD system are the same as the procedures of forming the $SrRuO_3$ film 103 in the first embodiment.

The following are the conditions for forming the $Ba_xSr_{1-x}RuO_3$ film 123.

The film forming pressures is 1 Torr, the film forming temperature is 550° C., raw materials used are $Sr(THD)_2$ dissolved into THF at the concentration of 0.1 mol/l, $Ru(THD)_3$ dissolved into THF at the concentration of 0.1 mol/l, and $Ba(THD)_2$ dissolved into THF at the concentration of 0.1 mol/l.

The flow rates for the individual liquid materials are 0.3 sccm for $Sr(THD)_2$/THF, 0.3 sccm for $Ba(THD)_2$ and 0.5 sccm for $Ru(THD)_3$/THF.

The temperature of the vaporizer for the Ba material is 180° C., and the temperatures of the vaporizers for the Sr and Ru materials are respectively 250° C. and 210° C., the same as those in the first embodiment. The other conditions are also the same as those of the first embodiment. The film formation is carried out for 30 minutes.

The thickness of the $Ba_xSr_{1-x}RuO_3$ film obtained by the above method was 80 nm. The (Sr+Ba)/Ru composition ratio was approximately 1 and the composition distribution of the $Ba_xSr_{1-x}RuO_3$ film 123 in the widthwise direction of the film was uniform over the entire film. The composition x was 0.2.

The uniformities of the film thickness and the composition over the substrate surface and among the 25 substrates were equal to or smaller than ±5%. Further, the X-ray diffraction measurement showed that the deposited $Ba_xSr_{1-x}RuO_3$ was a perovskite type polycrystal. The sheet resistance of the $Ba_xSr_{1-x}RuO_3$ film 123 was 40 Ω□.

As a comparative example, the $Ba_xSr_{1-x}RuO_3$ film was formed by CVD using $Ru(Cp)_2$ (CP: $C_5H_5$) dissolved into THF at the concentration of 0.1 mol/l as the Ru material.

At this time, the flow rate of the solution of the Ru material was 0.5 sccm and the temperature of the vaporizer was 150° C. The other procedures of forming the $Ba_xSr_{1-x}RuO_3$ film including the type of the Sr material and the feeding conditions were quite the same as those mentioned above.

The thickness of the $Ba_xSr_{1-x}RuO_3$ film formed in this manner was 80 nm, the same as the aforementioned one. However, the X-ray diffraction measurement showed that $Ba_xSr_{1-x}RuO_3$ had a peak whose intensity was merely about 1/7 of the peak intensity in the case where $Ru(THD)_3$ was used for the Ru material. The sheet resistance of the $Ba_xSr_{1-x}RuO_3$ film was 90 Ω□.

The results of measuring the composition distribution in the widthwise direction of the film showed (Sr+Ba)/Ru=1.3 at the depth of 50 nm from the surface and that the Ru content from the depth of 50 nm from the surface to the interface with the $SiO_2$ film was nearly 0 so that there was Sr—Ba—O in that range.

The factors to have increased the sheet resistance was the insulator, Sr—Ba—O, formed near the interface between the $SiO_2$ film and the $Ba_xSr_{1-x}RuO_3$ film and the (Sr+Ba)/Ru composition ratio being deviated from the stoichiometric composition of 1 even near the surface.

The fact that the presence of the incubation time in a case of using $Ru(Cp)_2$ as the Ru material inhibited Ru from being contained in the film in the initial stage of the film formation, leaving Sr—Ba—O, which formed Sr—Ba—O in the vicinity of the interface, is the same as for the case of the $SrRuO_3$ film in the first embodiment.

After film formation was repeated, deposition of an Ru oxide and Ru metal in the gas feeding pipe was found as per the case of forming the $SrRuO_3$ film in the first embodiment. The decomposition and deposition of the Ru material in the pipe caused the (Sr+Ba)/Ru composition ratio of the film to become larger than 1.

The following is the reason for the deposition of an Ru oxide and Ru metal in the pipe in the case of using $Ru(Cp)_2$. While decomposition of $Ru(Cp)_2$ occurred at about 200° C. or higher, the vaporization temperature of the Sr material was 250° C. so that the heating temperature for the gas feeding pipe was set to 260° C., resulting in decomposition of $Ru(Cp)_2$.

In the case of using $Ru(THD)_3$ for the Ru material, by way of contrast, no deposition was observed in the gas feeding pipe.

In the case of the $Ba_xSr_{1-x}RuO_3$ film, as in the case of the $SrRuO_3$ film in the first embodiment, it was confirmed that the use of THD compounds for all the materials for Ba, Sr and Ru ensured film formation by CVD in such a way as not to cause the non-uniformity of the composition in the widthwise direction of the film and as to prevent the composition controllability from being impaired by unstable feeding of the source gases. Further, when the $Ba_xSr_{1-x}RuO_3$ film was formed on various kinds of bases by CVD, there were no dependency of the composition on the bases.

Liquid materials having $Ba(THD)_3$, $Sr(THD)_2$ and $Ru(THD)_3$ dissolved in THF are used in this embodiment; however, the present inventors confirmed that even if an organic solvent other than THF were used as a solvent or the raw materials themselves were supplied in a gaseous phase caused by through sublimation, nearly the same results as obtained in this embodiment were acquired. That is, it was confirmed that quite the same advantages would be obtained as long as the types of compounds of the raw materials are all THD complexes regardless of how the raw materials are supplied.

FOURTH EMBODIMENT

FIGS. 7A through 7D are cross-sectional views illustrating the steps of a method of forming a two-dimensional capacitor according to a fourth embodiment of this invention. In this embodiment, the $SrRuO_3$ film formed by CVD is used as the lower electrode and the upper electrode, and the $Ba_xSr_{1-x}RuO_3$ film ($0 \leq x \leq 1$) formed by CVD is used as the capacitor insulating film.

Figure 7A:
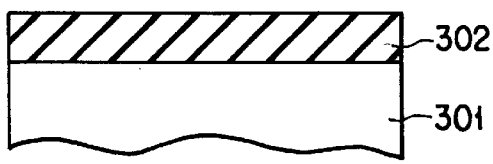
FIGS. 7A through 7D are cross-sectional views illustrating the steps of a method of forming a two-dimensional capacitor according to a fourth embodiment of this invention.

First, an $SiO_2$ film 302 having a thickness of 100 nm is formed on the surface of an Si substrate 301 by thermal oxidization, as shown in FIG. 7A.

Figure 7B:
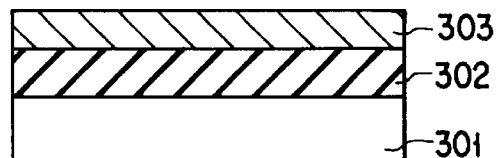

Next, as shown in FIG. 7B, a lower electrode 303 of $SrRuO_3$ with a thickness of 50 nm is formed on the $SiO_2$ film 302 by CVD using raw materials of $Sr(THD)_2$/THF (concentration of 0.1 mol/l) and $Ru(THD)_3$/THF (concentration of 0.1 mol/l) by the procedures and under the conditions as used in the first embodiment.

Figure 7C:
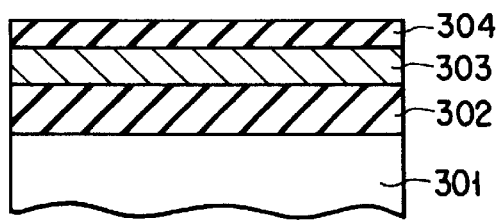

Then, a capacitor insulating film 304 of $Ba_xSr_{1-x}TiO_3$ is formed on the lower electrode 303 by CVD as shown in FIG. 7C. The composition x is 0.5 and the film thickness is 50 nm.

The $Ba_xSr_{1-x}TiO_3$ film is formed using a hot wall type CVD system similar to the one shown in FIG. 2. As the raw materials, $Ba(THD)_2$, $Sr(THD)_2$, $Ti(i-OPr)_2(THD)_2$ (where i-OPr is $OC_3H_7$) dissolved in THF are used.

Their concentrations are 0.1 mol/l for $Ba(THD)_2$/THF, 0.1 mol/l for $Sr(THD)_2$/THF and 0.3 mol/l for $Ti(i-OPr)_2(THD)_2$/THF.

After their flow rates are respectively controlled to 0.2 sccm, 0.2 sccm and 1 sccm, those liquid materials are turned into gases by the respective vaporizers that have been heated to 240° C., 250° C. and 200° C., and the gases are fed, together with the Ar carrier gas, into the furnace.

The other gases than the source gases supplied to the furnace are 100 sccm of Ar and 100 sccm of $O_2$. The film forming temperature is 440° C. and the film forming pressure is 1 Torr.

Since the $Ba_xSr_{1-x}TiO_3$ film obtained in this manner is amorphous, the $Ba_xSr_{1-x}TiO_3$ film is subjected to a continuous heat treatment in the same furnace for 20 minutes at 650° C. under the Ar environment in order to crystallize the film. As this heat treatment is conducted for crystallization, the environment is not essential but it is preferable to employ the $O_2$ environment to prevent separation of O from the $Ba_xSr_{1-x}TiO_3$ film in the heat treatment.

Figure 7D:
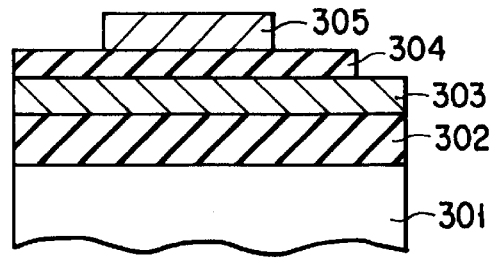

Next, after an $SrRuO_3$ film of 50 nm in thickness which will serve as an upper electrode 305 is formed on the capacitor insulating film 304 under the same conditions as those of the lower electrode 303, the $SrRuO_3$ film is processed using the photolithography technology and wet etching (or reactive ion etching), thereby forming the upper electrode 305, as shown in FIG. 7D. The upper electrode 305 has a size of 1 to 100,000 $\mu m^2$.

Finally, as shown in FIG. 7D, part of the capacitor insulating film 304 is removed by wet etching or reactive ion etching to thereby expose part of the lower electrode 303, allowing a terminal to be led out from the lower electrode 303 later.

The evaluation of the electric characteristics of the thus formed two-dimensional capacitor showed excellent results of a relative dielectric constant of 300, tan δ of 1% or smaller and a leak current is an order of $10^{-8}$ $A/cm^2$.

Similar two-dimensional capacitors were formed by changing the thickness of the capacitor insulating film 304, with such results that the dielectric constant was nearly constant regardless of the film thickness and no significant increase in leak current was observed even when the thickness of the capacitor insulating film 304 was reduced to 15 nm.

By way of contrast, similar capacitors were formed by using $Ru(Cp)_2$ as the Ru material in performing CVD to form the $SrRuO_3$ film, which would serve as the lower electrode 303 and the upper electrode 305, and their electric characteristics were likewise evaluated. The evaluation showed that while a low leak current of an order of 10–8 $A/cm^2$ was observed, the effective dielectric constant was 120 and tan δ was about 3%.

This is because the use of $Ru(Cp)_2$ as the Ru material in forming the $SrRuO_3$ film by CVD transformed the upper electrode 305 into an SrO film near the interface with the capacitor insulating film 304. In other words, the SrO film was an insulating film whose relative dielectric constant was considerably lower than that of the $Ba_{0.5}Sr_{0.5}TiO_3$ film, which would appear to have resulted in the aforementioned reductions in the capacitance of the capacitor and in the effective relative dielectric constant.

According to this embodiment, therefore, if the $SrRuO_3$ film in the two-dimensional BST capacitor which uses the $Ba_{0.5}Sr_5TiO_3$ film as the capacitor insulating film 304 and the $SrRuO_3$ film as the lower electrode 303 and the upper electrode 305 is formed by CVD using $Sr(THD)_2$ and $Ru(THD)_3$ as the raw materials, the $SrRuO_3$ film can be formed with a high composition controllability and excellent composition uniformity in the widthwise direction of the film. This can provide excellent electric characteristics.

Capacitors having the same performances as the above-described capacitor of this embodiment were acquired even when both or one of the lower electrode 303 and upper electrode 305 was formed of $Ca_xSr_{1-x}RuO_3$ or $Ba_xSr_{1-x}RuO_3$. Further, capacitors with similar characteristics could be acquired when the raw materials used to form the lower electrode 303 and upper electrode 305 were supplied in a gaseous phase caused by through sublimation, not using a THF solvent.

FIFTH EMBODIMENT

Figure 8A:
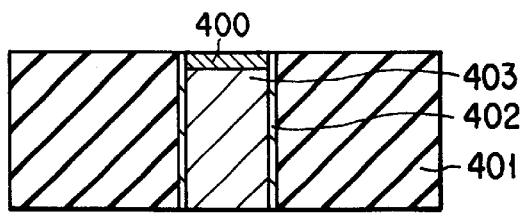
FIGS. 8A through 8D are cross-sectional views illustrating the steps of a method of forming a three-dimensional capacitor according to a fifth embodiment of this invention.
Figure 8B:
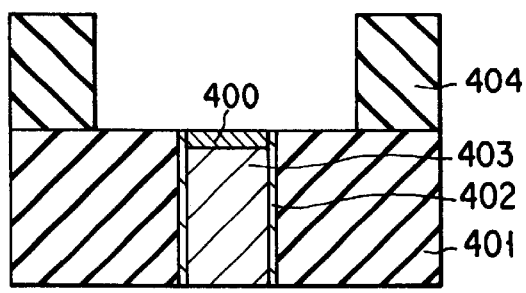
Figure 8C:
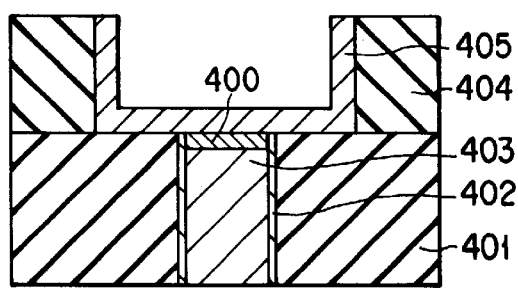

FIGS. 8A through 8C are cross-sectional views illustrating the steps of a method of forming a three-dimensional capacitor according to a fifth embodiment of this invention. In this embodiment, the $SrRuO_3$ film formed by CVD is used as a storage node electrode and a plate electrode, and the $Ba_xSr_{1-x}TiO_3$ film ($0 \leq x \leq 1$) formed by CVD is used as the capacitor insulating film.

First, as shown in FIG. 8A, a contact hole is formed in an $SiO_2$-based first interlayer insulating film 401, a barrier metal film 402 consisting of a lamination of a TiN film and a Ti film is formed on the side wall of the contact hole, and then the contact hole is buried with a tungsten plug (W plug) 403 via the barrier metal film 402.

This W plug 403 is formed by deposing a W film on the entire surface by CVD so as to completely bury the contact hole and then polishing out the excess W film outside the contract hole by CMP.

Further, a barrier metal film 400, such as a TiN film, a TiAl film or an Ru film may be formed on the top of the W plug 403.

Then, after an $SiO_2$-based second interlayer insulating film 404 is formed on the entire surface, an opening is formed in this second interlayer insulating film 404 in such a way as to expose the W plug 403 and an area around it, as shown in FIG. 8B.

Next, as shown in FIG. 8C, an $SrRuO_3$ film with a thickness of 30 nm which will become a storage node electrode 405 is formed on the entire surface by the method that has been discussed in the section of the first embodiment, then the excess $SrRuO_3$ film outside the opening is removed by CMP, thereby forming the storage node electrode 405.

Figure 8D:
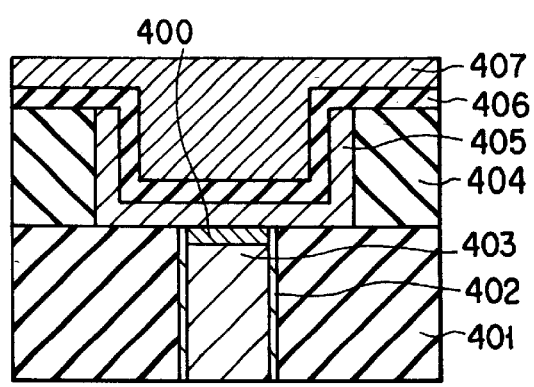

Finally, as shown in FIG. 8D, a $Ba_{0.5}Sr_{0.5}TiO_3$ with a thickness of 20 nm as a capacitor insulating film 406 is formed on the entire surface by the CVD method that has been discussed in the section of the fourth embodiment, followed by the continuous deposition of an $SrRuO_3$ film as a plate electrode 407 on the entire surface by the CVD method that has been discussed in the section of the first embodiment.

The results of observation of the cross-sectional structure of the thus prepared three-dimensional capacitor showed that the storage node electrode 405 and the capacitor insulating film 406 were formed with uniform thicknesses on the side wall and the bottom of the opening, with no variation in composition observed with regard to both the widthwise direction of the thickness and the base. The capacitor insulating film 406 was the $Ba_{0.5}Sr_{0.5}TiO_3$ film whose x composition ratio in the $Ba_xSr_{1-x}TiO_3$ film was 0.5.

The results of measuring the electric characteristics of the three-dimensional capacitor of this embodiment showed that the capacitance was increased from that of the two-dimensional capacitor of the fourth embodiment by the amount that matched with an increase in the area of the capacitor resulting from the three-dimensional structure. Further, a small leak current of $10^{-8}$ A/cm$^2$ which matched with the value of the two-dimensional capacitor of the fourth embodiment was obtained.

As a comparative example, a similar capacitor was formed using the conventional $Ru(Cp)_2$ as the Ru material at the time of conducting CVD to form the $SrRuO_3$ film that would serve as the storage node electrode 405 and plate electrode 407, with the result that its electric characteristics could not be measured.

This is because that as discussed in the foregoing descriptions of the first to fourth embodiments, when $Ru(Cp)_2$ was used as the Ru material in forming the $SrRuO_3$ film, SrO or an insulator was formed in the initial stage of formation, inhibiting the electric connection between the W plug 403 and the storage node electrode 405.

When $Ru(THD)_3$ is used as the Ru material as in this embodiment, by way of contrast, SrO is not formed in the initial stage of formation, yielding a uniform $SrRuO_3$ film. This can ensure the electric connection between the W plug 403 and the storage node electrode 405 and provide an excellent capacitor characteristic. Therefore, the use of the method of forming a three-dimensional capacitor according to this embodiment in manufacturing a large-scale DRAM can significantly improve the performance of the capacitor.

SIXTH EMBODIMENT

FIGS. 9A through 9D are cross-sectional views illustrating the steps of a method of forming a three-dimensional capacitor according to a sixth embodiment of this invention. In the capacitor of this embodiment like that of the fifth embodiment, though their structures differ from each other, the $SrRuO_3$ film formed by CVD is used as a storage node electrode and a plate electrode, and the $Ba_xSr_{1-x}TiO_3$ film ($0 \leq x \leq 1$) formed by CVD is used as the capacitor insulating film.

Figure 9A:
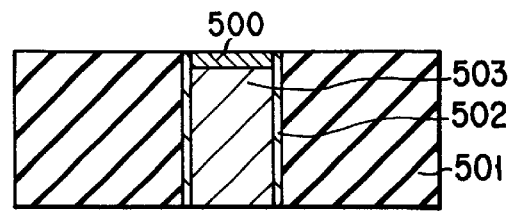
FIGS. 9A through 9D are cross-sectional views illustrating the steps of a method of forming a three-dimensional capacitor according to a sixth embodiment of this invention.

First, as shown in FIG. 9A, a contact hole is formed in an $SiO_2$-based first interlayer insulating film 501, a barrier metal film 502 consisting of a lamination of a TiN film and a Ti film is formed on the side wall of the contact hole, and then the contact hole is buried with a tungsten plug (W plug) 503 via the barrier metal film 502. The steps up to this point are the same as those of the fifth embodiment. Further, a barrier metal film 500, such as a TiN film, a TiAl film or an Ru film may be formed on the top of the W plug 503, as per the fifth embodiment.

Figure 9B:
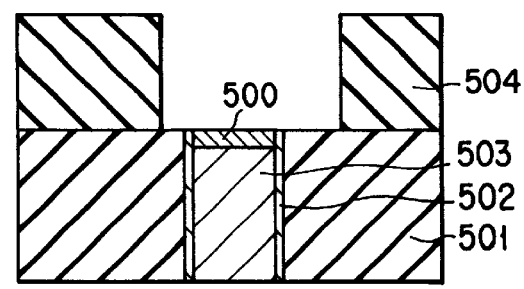

Then, after an $SiO_2$-based second interlayer insulating film 504 is deposited on the entire surface, an opening is formed in this second interlayer insulating film 504 by RIE in such a way as to expose the W plug 503 and an area around it, as shown in FIG. 9B.

Figure 9C:
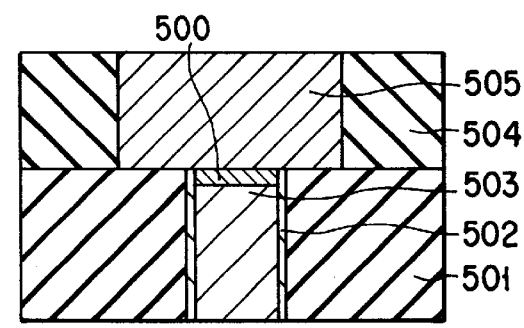

Next, as shown in FIG. 9C, a storage node electrode of $SrRuO_3$ is buried in the opening of the second interlayer insulating film 504. Specifically, the SrRuO₃ film is formed on the entire surface by the method that has been discussed in the section of the first embodiment in such a manner as to completely bury the opening in second interlayer insulating film 504, and then the excess SrRuO₃ film outside the opening is removed, thereby forming the storage node electrode 505. Then, the second interlayer insulating film 504 is removed.

Figure 9D:
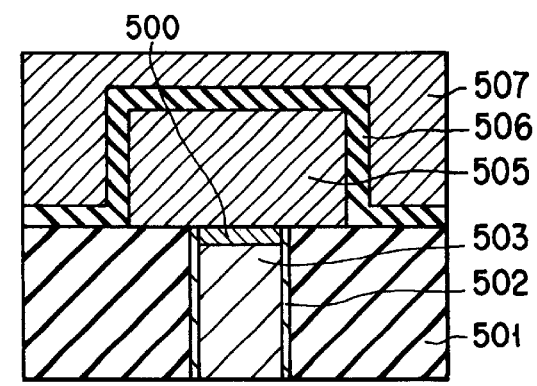

Finally, as shown in FIG. 9D, a $Ba_{0.5}Sr_{0.5}TiO_3$ with a thickness of 20 nm is formed as a capacitor insulating film 506 by the CVD method that has been discussed in the section of the fourth embodiment, then an SrRuO₃ film is formed as a plate electrode 507 by the CVD method that has been discussed in the section of the first embodiment.

The results of observation of the cross-sectional structure of the thus prepared three-dimensional capacitor showed that the storage node electrode 505 with a uniform thickness was formed on the first interlayer insulating film 501, the barrier metal film 502 and the W plug 503, with no variation in composition observed with regard to both the widthwise direction of the thickness and the base.

In this case, as in the fifth embodiment, it was found that the capacitance was increased from that of the two-dimensional capacitor of the fourth embodiment by the amount that matched with an increase in the area of the capacitor resulting from the three-dimensional structure. Further, a small leak current of $10^{-8}$ A/cm² which matched with the value of the two-dimensional capacitor of the fourth embodiment was obtained.

A similar capacitor was formed as a comparative example using the conventional Ru(Cp)₂ as the Ru material at the time of conducting CVD to form the SrRuO₃ film that would serve as the storage node electrode 505 and plate electrode 507, with the result that its electric characteristics could not be measured.

This is because that as discussed in the foregoing descriptions of the first to fourth embodiments, when Ru(Cp)₂ was used as the Ru material in forming the SrRuO₃ film, SrO or an insulator was formed in the initial stage of formation, inhibiting the electric connection between the W plug 503 and the storage node electrode 505.

When Ru(THD)₃ is used as the Ru material as in this embodiment, by way of contrast, SrO is not formed in the initial stage of formation, yielding a uniform SrRuO₃ film. This can ensure the electric connection between the W plug 503 and the storage node electrode 505 and provide an excellent capacitor characteristic.

Therefore, the use of the method of forming a three-dimensional capacitor according to this embodiment in manufacturing a large-scale DRAM can significantly improve the performance of the capacitor.

The present inventors evaluated capacitors using a $Ca_xSr_{1-x}RuO_3$ film ($0 \leq x \leq 1$) or a $Ba_xSr_{1-x}RuO_3$ film ($0 \leq x \leq 1$) as the storage node electrode 405 and plate electrode 407 in FIG. 8D and as the storage node electrode 505 and plate electrode 507 in FIG. 9D.

The results showed that the electric characteristics of the capacitors could not be measured when using Ru(Cp)₂ as the Ru material, whereas an excellent capacitor characteristic could be acquired as in the case of the capacitor having the SrRuO₃ film that has been explained in the sections of the fifth and sixth embodiments, when Ru(THD)₃ was used as the Ru material as done in the second and third embodiments.

It is to be noted that this invention is not limited to the above-described embodiments. In the above-described embodiments, THD complexes are used for all the CVD raw materials. Advantages similar to those of this invention can however be acquired even when a β diketone complex is used instead of a THD compound. The advantages of this invention can similarly be obtained by using a compound obtained by altering a THD compound.

Although the foregoing description of the embodiments has been given of the case where the capacitor insulating film is a $Ba_{0.5}Sr_{0.5}TiO_3$ film (high dielectric film), this invention can be applied to a case where other high dielectric films are used.

Although the foregoing description of the embodiments has been given of the case where a high dielectric film is used as the capacitor insulating film, this invention can be adapted to a case where a ferroelectric film such as an SBT film or PZT film is used as the capacitor insulating film. Specifically, this invention can be adapted to a capacitor electrode for an FRAM in which each memory cell is comprised of a single capacitor and a single transistor.

It should be apparent to those skilled in the art that the present invention may be embodied in many other specific forms without departing from the spirit or scope of the invention.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A conductive film forming method comprising:
   preparing a substrate;
   forming a plurality of regions of different materials on a same surface of said substrate; and
   forming a conductive film of ARuO₃ (A being a substance containing at least one of elements Ca, Sr and Ba) on said regions on the substrate by CVD using a THD compound of Ru $\{Ru(C_{11}H_{19}O_2)\}$ as β diketone complex of Ru as an Ru material.

2. The conductive film forming method according to claim 1, wherein said AruO₃ is SrRuO₃.

3. A capacitor forming method comprising:
   preparing a substrate;
   forming a plurality of regions of different materials on a same surface of said substrate;
   forming a lower electrode on the plurality of regions of different materials on a same surface of said substrate;
   forming a capacitor insulating film of $Ba_xSr_{1-x}TiO_3$ ($0 \leq x \leq 1$) on said lower electrode; and
   forming an upper electrode on said capacitor insulating film,
   as at least said lower electrode, a conductive film of ARuO₃ (A being a substance containing at least one of elements Ca, Sr and Ba) being formed on said regions on the substrate by CVD using a THD compound of Ru $\{Ru(C_{11}H_{19}O_2)\}$ as β diketone complex of Ru as an Ru material.

4. The capacitor forming method according to claim 3, wherein said AruO₃ is SrRuO₃.

5. A capacitor forming method comprising:
   preparing a semiconductor substrate having a conductive region;
   forming a first insulating film on said semiconductor substrate;

forming a first opening in said first insulating film and burying inside said first opening with a connecting member which electrically connects to said conductive region;

forming a lower electrode having a first part electrically connected to said connecting member and a second part contacting to said first insulating film;

forming a capacitor insulating film of $Ba_xSr_{1-x}TiO_3$ ($0 \leq x \leq 1$) on said lower electrode; and forming an upper electrode on said capacitor insulating film, as at least said lower electrode, a conductive film of $ARuO_3$ (A being a substance containing at least one of elements Ca, Sr and Ba) being formed on said first insulating film and said connecting member by CVD using a THD compound of Ru $\{Ru(C_{11}H_{19}O_2)\}$ as β diketone complex of Ru as an Ru material.

6. The capacitor forming method according to claim 5, wherein after said connecting member is formed, a second insulating film having a second opening for exposing a region including said connecting member is formed on said first insulating film, said lower electrode is formed on a bottom and a side wall of said second opening in such a way as not to fill inside said second opening, said capacitor insulating film is formed on said lower electrode in such a way as not to fill inside said second opening, and upper electrode is formed on said capacitor insulating film in such a way as to fill inside said second opening.

7. The capacitor forming method according to claim 6, wherein said connecting member is formed after a barrier metal film is formed on said side wall of said second opening.

8. The capacitor forming method according to claim 6, wherein said connecting member is of tungsten.

9. The capacitor forming method according to claim 6, wherein a barrier metal film is formed on a top surface of said connecting member.

10. The capacitor forming method according to claim 9, wherein said barrier metal film is one of a TiN film, TiAlN film and Ru film.

11. The capacitor forming method according to claim 5, wherein after said connecting member is formed, a second insulating film having a second opening for exposing a region including said connecting member is formed on said first insulating film, inside said second opening is filled with said lower electrode, said second insulating film is removed, and said capacitor insulating film and said upper electrode are formed on said first insulating film in such a way as to cover said lower electrode.

12. The capacitor forming method according to claim 11, wherein said connecting member is formed after a barrier metal film is formed on a side wall of said first opening.

13. The capacitor forming method according to claim 12, wherein said barrier metal film is one of a TiN film, TiAlN film and Ru film.

14. The capacitor forming method according to claim 11, wherein said connecting member is a tungsten plug.

15. The capacitor forming method according to claim 4, wherein said barrier metal film is formed on a top surface of said connecting member.

* * * * *

UNITED STATES PATENT AND TRADEMARK OFFICE
CERTIFICATE OF CORRECTION

PATENT NO. : 6,297,122 B1
DATED : October 2, 2001
INVENTOR(S) : Kazuhiro Eguchi et al.

It is certified that error appears in the above-identified patent and that said Letters Patent is hereby corrected as shown below:

Column 16,
Lines 50-51, "($0 \leq x \leq 1$)" should read -- ($0 \leq x \leq 1$) --.

Column 17,
Lines 8-9, "($0 \leq x \leq 1$)" should read -- ($0 \leq x \leq 1$) --.

Column 18,
Line 28, "claim 4" should read -- claim 11 --.

Signed and Sealed this

Fourteenth Day of May, 2002

Attest:

*Attesting Officer*

JAMES E. ROGAN
*Director of the United States Patent and Trademark Office*